US 011508177B2

(12) United States Patent
Wang et al.

(10) Patent No.: US 11,508,177 B2
(45) Date of Patent: Nov. 22, 2022

(54) DISPLAY PANEL INCLUDING LIGHT SHIELD LAYER AND OPTICAL PROCESSING FILM, MANUFACTURING METHOD THEREOF AND DISPLAY DEVICE

(71) Applicants: CHENGDU BOE OPTOELECTRONICS TECHNOLOGY CO., LTD., Chengdu (CN); BOE TECHNOLOGY GROUP CO., LTD., Beijing (CN)

(72) Inventors: Guangdong Wang, Beijing (CN); Yiming Wang, Beijing (CN); Zhenyu Wang, Beijing (CN); Chen Wang, Beijing (CN)

(73) Assignees: CHENGDU BOE OPTOELECTRONICS TECHNOLOGY CO., LTD., Sichuan (CN); BEIJING BOE TECHNOLOGY DEVELOPMENT CO., LTD., Beijing (CN)

( * ) Notice: Subject to any disclaimer, the term of this patent is extended or adjusted under 35 U.S.C. 154(b) by 114 days.

(21) Appl. No.: 16/633,014

(22) PCT Filed: Jun. 25, 2019

(86) PCT No.: PCT/CN2019/092817
§ 371 (c)(1),
(2) Date: Jan. 22, 2020

(87) PCT Pub. No.: WO2020/048190
PCT Pub. Date: Mar. 12, 2020

(65) Prior Publication Data
US 2021/0142027 A1 May 13, 2021

(30) Foreign Application Priority Data
Sep. 5, 2018 (CN) .......................... 201811031248.9

(51) Int. Cl.
*G06V 40/13* (2022.01)
*H01L 27/32* (2006.01)
(Continued)

(52) U.S. Cl.
CPC ........ *G06V 40/1318* (2022.01); *H01L 27/326* (2013.01); *H01L 27/3227* (2013.01);
(Continued)

(58) Field of Classification Search
CPC .. G06K 9/0004; G06K 9/00013; G06F 3/042; G06F 3/0421; G02F 1/136209
See application file for complete search history.

(56) References Cited

U.S. PATENT DOCUMENTS

| 2010/0295042 | A1* | 11/2010 | Yano | H01L 29/7869 257/43 |
| 2014/0001588 | A1* | 1/2014 | Sun | H01L 27/14621 257/432 |
| 2016/0342058 | A1* | 11/2016 | Park | H01L 27/124 |
| 2017/0192321 | A1* | 7/2017 | Li | G02F 1/136209 |
| 2018/0005007 | A1* | 1/2018 | Du | G06K 9/2036 |

(Continued)

FOREIGN PATENT DOCUMENTS

| CN | 105529301 A | 4/2016 |
| CN | 105549257 A * | 5/2016 |

(Continued)

*Primary Examiner* — Yuzhen Shen
(74) *Attorney, Agent, or Firm* — Dilworth & Barrese, LLP.; Michael J. Musella, Esq.

(57) ABSTRACT

A display panel, a manufacturing method thereof and a display device are provided. The display panel includes: a photosensitive sensor; a light shield layer disposed on a sensing side of the photosensitive sensor and including at least one first opening and at least one second opening, the first opening and the photosensitive sensor are overlapped with each other in a direction perpendicular to a surface of the display panel, so that light running through the first opening is irradiated to the photosensitive sensor; and an optical processing film disposed in a region of the light shield layer close to the second opening and on at least a (Continued)

portion of a surface of the light shield layer away from the photosensitive sensor, and a light reflectivity of the optical processing film is less than a light reflectivity of the light shield layer.

17 Claims, 4 Drawing Sheets

(51) Int. Cl.
  *H01L 51/52* (2006.01)
  *H01L 51/56* (2006.01)
(52) U.S. Cl.
  CPC ...... *H01L 27/3234* (2013.01); *H01L 51/5284* (2013.01); *H01L 51/56* (2013.01)

(56) References Cited

U.S. PATENT DOCUMENTS

| | | | |
|---|---|---|---|
| 2019/0006440 A1 | 1/2019 | Sun et al. | |
| 2019/0051709 A1* | 2/2019 | Puszka | H01L 51/5281 |
| 2019/0079338 A1* | 3/2019 | Liu | G02F 1/0136 |
| 2019/0280039 A1 | 9/2019 | Jia et al. | |
| 2019/0387141 A1* | 12/2019 | Chung | G02B 5/284 |
| 2020/0287049 A1* | 9/2020 | Jang | H01L 27/3262 |

FOREIGN PATENT DOCUMENTS

| | | |
|---|---|---|
| CN | 106373969 A | 2/2017 |
| CN | 108242453 A | 7/2018 |
| CN | 109190563 A | 1/2019 |
| WO | 2016104216 A1 | 6/2016 |

* cited by examiner

DISPLAY PANEL INCLUDING LIGHT SHIELD LAYER AND OPTICAL PROCESSING FILM, MANUFACTURING METHOD THEREOF AND DISPLAY DEVICE

The application claims priority to the Chinese patent application No. 201811031248.9, filed Sep. 5, 2018, the disclosure of which is incorporated herein by reference as part of the application.

TECHNICAL FIELD

The embodiments of the present disclosure relate to a display panel, a manufacturing method thereof and a display device.

BACKGROUND

Fingerprint recognition technology includes optical technology, ultrasonic technology, etc. Optical fingerprint recognition technology is to project lines on a fingerprint recognition device under the illumination of a light source, and then form a digital fingerprint image that can be processed by the fingerprint device algorithm in which ridge lines (lines with a certain width and direction in the fingerprint image) are black and valley lines (recessed portions between lines) are white.

At present, fingerprint recognition devices have been widely used in portable electronic devices such as mobile phones and tablet computers.

SUMMARY

At least one embodiment of the present disclosure provides a display panel, and the display panel comprises: a photosensitive sensor, a light shield layer disposed on a sensing side of the photosensitive sensor and including at least one first opening and at least one second opening, and an optical processing film disposed in a region of the light shield layer close to the second opening and on at least a portion of a surface of the light shield layer away from the photosensitive sensor, the first opening and the photosensitive sensor are overlapped with each other in a direction perpendicular to a surface of the display panel, so that light running through the first opening is irradiated to the photosensitive sensor, and a light reflectivity of the optical processing film is less than a light reflectivity of the light shield layer.

For example, the display panel provided by at least an embodiment of the present disclosure further comprises a functional layer disposed on a side of the light shield layer away from the photosensitive sensor, and the functional layer includes at least one fourth opening, and the fourth opening and at least a portion of the optical processing film are overlapped with each other in the direction perpendicular to the surface of the display panel.

For example, in the display panel provided by at least an embodiment of the present disclosure, the fourth opening completely overlaps with the optical processing film in the direction perpendicular to the surface of the display panel, the functional layer also includes at least one third opening, and the third opening and the first opening are overlapped with each other in the direction perpendicular to the surface of the display panel, so that light running through the first opening and the third opening is irradiated to the photosensitive sensor.

For example, in the display panel provided by at least an embodiment of the present disclosure, an orthographic projection of the second opening in a direction parallel to the surface of the display panel is close to an orthographic projection of the fourth opening in the direction parallel to the surface of the display panel; and the second opening corresponds to a non-opening region of the functional layer.

For example, in the display panel provided by at least an embodiment of the present disclosure, the functional layer includes an electrode layer; and the photosensitive sensor is configured for line recognition.

For example, the display panel provided by at least an embodiment of the present disclosure further comprises a base substrate, and the photosensitive sensor is disposed on the base substrate, and the light shield layer is disposed on a side of the photosensitive sensor away from the base substrate.

For example, the display panel provided by at least an embodiment of the present disclosure further comprises a base substrate, the photosensitive sensor and the light shield layer are respectively disposed on two sides of the base substrate.

For example, in the display panel provided by at least an embodiment of the present disclosure, the display panel comprises a plurality of pixel units disposed on the base substrate, each of the plurality of pixel units corresponds to at least one first opening and at least one second opening; and the photosensitive sensor corresponds to the plurality of pixel units.

For example, in the display panel provided by at least an embodiment of the present disclosure, the light shield layer is a first conductive layer, and the first conductive layer includes: a plurality of conductive parts that are electrically connected to each of the plurality of pixel units and configured to apply electrical signals to each of the plurality of pixel units.

For example, in the display panel provided by at least an embodiment of the present disclosure, the optical processing film includes a light absorption material.

For example, in the display panel provided by at least an embodiment of the present disclosure, a material of the light shield layer includes one or more selected from titanium, aluminum and molybdenum; and a material of the optical processing film includes molybdenum oxide.

At least one embodiment of the present disclosure provides a manufacturing method of a display panel, the manufacturing method comprises: providing a photosensitive sensor; forming a light shield layer on a sensing side of the photosensitive sensor, and forming an optical processing film, the light shield layer includes at least one first opening and at least one second opening, and the first opening and the photosensitive sensor are overlapped with each other in a direction perpendicular to a surface of the display panel, so that light running through the first opening is irradiated to the photosensitive sensor, and the optical processing film is formed in a region of the light shield layer close to the second opening and on at least a portion of a surface of the light shield layer away from the photosensitive sensor, and a light reflectivity of the optical processing film is less than a light reflectivity of the light shield layer.

For example, the manufacturing method of the display panel provided by at least an embodiment of the present disclosure further comprises: forming a functional layer on a side of the light shield layer away from the photosensitive sensor, and the functional layer includes at least one fourth opening, and the fourth opening and at least a portion of the optical processing film are overlapped with each other in the direction perpendicular to the surface of the display panel.

For example, in the manufacturing method of the display panel provided by at least an embodiment of the present disclosure, the forming the optical processing film includes: forming an optical processing film material layer on the light shield layer; and performing a photolithography process on the optical processing film material layer, and forming the optical processing film in the region of the light shield layer close to the second opening and on at least a portion of a surface of the light shield layer away from the photosensitive sensor.

For example, in the manufacturing method of the display panel provided by at least an embodiment of the present disclosure, a material of the light shield layer includes molybdenum, and a material of the optical processing film includes molybdenum oxide; and the forming the optical processing film includes: performing oxide plasma treatment on the light shield layer in the region of the light shield layer close to the second opening and on at least a portion of a surface of the light shield layer away from the photosensitive sensor, to form the optical processing film on the surface of the light shield layer.

For example, in the manufacturing method of the display panel provided by at least an embodiment of the present disclosure, the forming the optical processing film also includes: forming a photoresist pattern on the light shield layer, in which the photoresist pattern exposes the region of the light shield layer close to the second opening and the at least the portion of a surface of the light shield layer away from the photosensitive sensor; and subsequently performing oxide plasma treatment on the light shield layer.

For example, in the manufacturing method of the display panel provided by at least an embodiment of the present disclosure, a material of the light shield layer includes molybdenum, and a material of the optical processing film includes molybdenum oxide; and the forming the optical processing film includes: depositing material molybdenum under an oxygen atmosphere in the region of the light shield layer close to the second opening and on at least a portion of a surface of the light shield layer away from the photosensitive sensor, so that a material finally deposited on the light shield layer includes molybdenum oxide.

For example, the manufacturing method of the display panel provided by at least an embodiment of the present disclosure further comprises providing a base substrate, and the photosensitive sensor is formed on the base substrate, and the light shield layer is formed on a side of the photosensitive sensor away from the base substrate.

For example, the manufacturing method of the display panel provided by at least an embodiment of the present disclosure further comprises providing a base substrate, and the light shield layer and the photosensitive sensor are respectively formed on two sides of the base substrate.

At least one embodiment of the present disclosure provides a display device, and the display device comprises any display panel as mentioned above.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

Unless otherwise defined, all the technical and scientific terms used herein have the same meanings as commonly understood by one of ordinary skill in the art to which the present disclosure belongs. The terms, such as "first," "second," or the like, which are used in the description and the claims of the present disclosure, are not intended to indicate any sequence, amount or importance, but for distinguishing various components. The terms, such as "comprise/comprising," "include/including," or the like are intended to specify that the elements or the objects stated before these terms encompass the elements or the objects and equivalents thereof listed after these terms, but not preclude other elements or objects. The terms, such as "connect/connecting/connected," "couple/coupling/coupled" or the like, are not limited to a physical connection or mechanical connection, but may include an electrical connection/coupling, directly or indirectly. The terms, "on," "under," "left," "right," or the like are only used to indicate relative position relationship, and when the position of the object which is described is changed, the relative position relationship may be changed accordingly.

Figure 1:
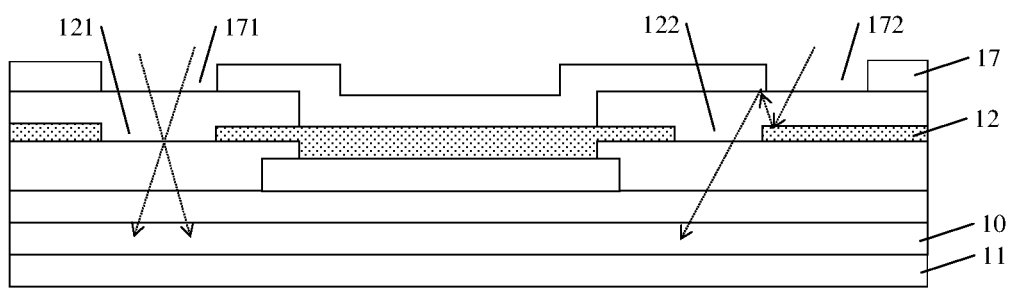
FIG. 1 is a schematic diagram of a display panel.

Current electronic devices usually integrate, for example, a fingerprint recognition device for personal identification with a display screen, so that the fingerprint recognition device can be used to implement functions such as the unlocking of a display screen. For instance, FIG. 1 shows a display panel, which comprises a base substrate 10, a fingerprint recognition device 11 disposed on a side of the base substrate 10, a light shield layer 12 disposed on the base substrate, and other structures. The light shield layer 12 generally includes a plurality of openings, for example, at least one first opening 121 and at least one second opening 122. The first opening 121 is used for fingerprint recognition and overlapped with the fingerprint recognition device 11 in a direction perpendicular to a surface of the display panel, so that light running through the first opening 121 can be irradiated to the fingerprint recognition device 11. The second opening 122, for example, is an opening that is set due to the structural requirements of the display panel, and is not used for fingerprint recognition.

For instance, the display panel further comprises other functional layers disposed on the light shield layer 12, e.g., an electrode layer 17. The electrode layer 17 also generally includes a plurality of openings, for example, at least one third opening 171 and at least one fourth opening 172. The third opening 171 is overlapped with the first opening 121 in the direction perpendicular to the surface of the display panel, so that light running through the first opening 121 and the third opening 171 can be irradiated to the fingerprint recognition device 11. The fourth openings 172 are, for example, gaps formed in order to form a plurality of patterned electrodes, such as strip electrodes, in the electrode layer 17.

For instance, the light shield layer 12 and the electrode layer 17 are generally made from metal or other conductive materials. These materials tend to have high light reflectivity. Thus, light incident from the second opening 172 of the electrode layer 17 tends to be reflected by the light shield layer 12 and the electrode layer 17, so that, as shown in FIG. 1, reflected light may be incident into the fingerprint recognition device 11 from the second opening 122 of the light shield layer 12. The light incident from the second opening 122 is not used for fingerprint recognition and then will interfere with the fingerprint recognition device 11 to reduce the recognition precision of the fingerprint recognition device 11.

At least one embodiment of the present disclosure provides a display panel, which comprises: a photosensitive sensor; a light shield layer, disposed on a sensing side of the photosensitive sensor and including at least one first opening and at least one second opening, in which the first opening is overlapped with the photosensitive sensor in a direction perpendicular to a surface of the display panel, so that light running through the first opening can be irradiated to the photosensitive sensor; and an optical processing film, disposed in a region of the light shield layer close to the second opening and on at least a portion of a surface of the light shield layer away from the photosensitive sensor, in which a light reflectivity of the optical processing film is less than a light reflectivity of the light shield layer.

At least one embodiment of the present disclosure provides a method for manufacturing a display panel, which comprises: providing a photosensitive sensor; forming a light shied layer on a sensing side of the photosensitive sensor, in which the light shield layer includes at least one first opening and at least one second opening, and the first opening is overlapped with the photosensitive sensor in a direction perpendicular to a surface of the display panel, so that light running through the first opening can be irradiated to the photosensitive sensor; and forming an optical processing film, in which the optical processing film is formed in a region of the light shield layer close to the second opening and on at least a portion of a surface of the light shield layer away from the photosensitive sensor, and the light reflectivity of the optical processing film is less than the light reflectivity of the light shield layer.

At least one embodiment of the present disclosure provides a display device, which comprises the foregoing display panel.

Description will be given below to the display panel, the manufacturing method thereof, and the display device provided by the present disclosure with reference to several specific embodiments.

Figure 2:
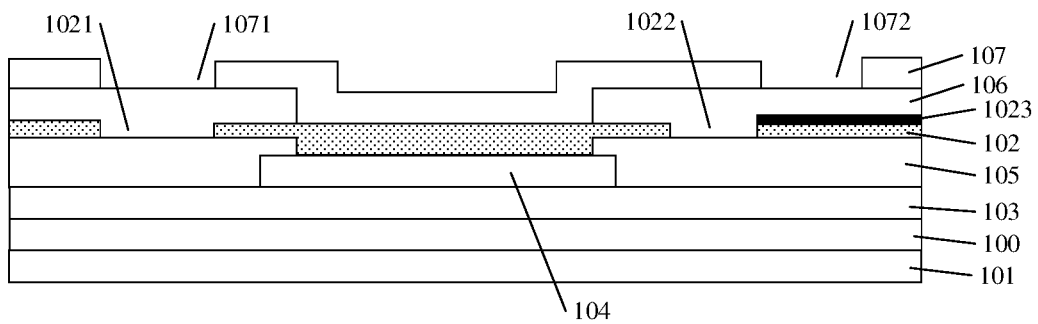
FIG. 2 is a schematic diagram of a display panel provided by an embodiment of the present disclosure.
Figure 3:
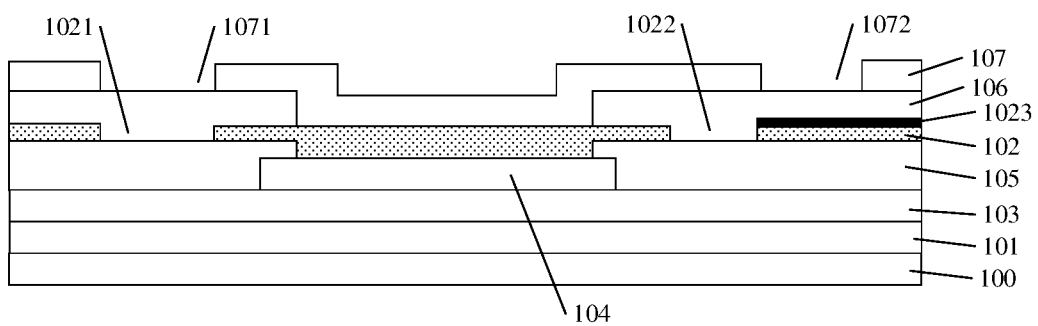
FIG. 3 is a schematic diagram of another display panel provided by an embodiment of the present disclosure.

At least one embodiment of the present disclosure provides a display panel. As shown in FIGS. 2 and 3, the display panel comprises a photosensitive sensor 101, a light shield layer 102 and an optical processing film 1023. The light shield layer 102 is disposed on a sensing side of the photosensitive sensor 101. The sensing side is a side of the photosensitive sensor for receiving light, for example, corresponding to a display side of the display panel. The light shield layer 102 includes at least one first opening 1021 and at least one second opening 1022. The first opening 1021 is overlapped with the photosensitive sensor 101 in a direction perpendicular to a surface of the display panel, so that light running through the first opening 1021 can be irradiated to the photosensitive sensor 101. The optical processing film 1023 is disposed in a region of the light shield layer 102 close to the second opening 1022 and on at least a portion of a surface of the light shield layer away from the photosensitive sensor 101. The light reflectivity of the optical processing film 1023 is less than the light reflectivity of the light shield layer 102.

For instance, the description that the optical processing film 1023 is disposed in a region of the light shield layer 102 close to the second opening 1022 includes: the optical processing film 1023 is disposed in an edge region of the second opening 1022, for example, arranged closely around the second opening 1022. Or the optical processing film 1023 is disposed within a region which has a small distance, e.g., 3 nm, from the second opening 1022. No specific limitation will be given here in the embodiment of the present disclosure. Thus, the optical processing film 1023 can fully avoid a case that light is reflected into the second opening 1022 at a periphery of the second opening 1022. For instance, the reflectivity of the light shield layer 102 is generally 30%-60%, and the light reflectivity of the optical processing film 1023 is set to be less than 10%, for example, less than 5%, so the optical processing film 1023 can reduce and even eliminate light reflection.

For instance, in the embodiment, the display panel further comprises a base substrate 100. For instance, the photosensitive sensor 101 is disposed on the base substrate 100, and the light shield layer 102 is disposed on a side of the photosensitive sensor 101 away from the base substrate 100, namely as the case shown in FIG. 3. Or in another example, the photosensitive sensor 101 and the light shield layer 102 are respectively disposed on two sides of the base substrate 100, namely as the case shown in FIG. 2.

For instance, the photosensitive sensor 101 may be a sensor with personal identification function such as line recognition (such as fingerprint recognition or palm print recognition) and iris recognition, and can realize functions such as the unlocking of a display screen of the display panel. For instance, in the embodiment, the photosensitive sensor 101 is used for line recognition. At this point, the photosensitive sensor 101 may process and recognize light incident from the first opening 1021 in the light shield layer 102, namely the first opening 1021 in the light shield layer 102 is configured to input effective light information into the photosensitive sensor 101.

For instance, in the embodiment, the display panel further comprises a functional layer arranged on a side of the light shield layer 102 away from the photosensitive sensor 101. The functional layer, for example, includes an electrode layer 107 of the display panel. The electrode layer 107, for example, is used for providing driving voltage to a light emitting structure (such as an organic light-emitting diode (OLED)) of the display panel, for example, used as an anode of the light emitting structure. The functional layer, such as the electrode layer 107, includes at least one fourth opening 1072. The fourth opening 1072 is overlapped with at least a portion of the optical processing film 1023 in the direction perpendicular to the surface of the display panel. For instance, an orthographic projection of the fourth opening 1072 on the optical processing film 1023 falls within the optical processing film 1023. Thus, when light is incident from the fourth opening 1072, the optical processing film 1023 can reduce and even eliminate the reflection of the light, so that the light will not be incident into the photosensitive sensor 101 from the second opening 1022 of the light shield layer 102 and then will not affect the sensing accuracy of the photosensitive sensor 101.

For instance, in some embodiments, an orthographic projection of the second opening 1022 in a direction parallel to the surface of the display panel is close to an orthographic projection of the fourth opening 1072 in the direction parallel to the surface of the display panel. For instance, the orthographic projection of the second opening 1022 in the direction parallel to the surface of the display panel is adjacent to the orthographic projection of the fourth opening 1072 in the direction parallel to the surface of the display panel or a distance between the orthographic projection of the second opening 1022 in the direction parallel to the surface of the display panel and the orthographic projection of the fourth opening 1072 in the direction parallel to the surface of the display panel is a very small distance, for example, within the range of 3 µm. For instance, the second opening 1022 corresponds to a non-opening region (namely a non-display region) of the functional layer. Thus, the arrangement of the second opening 1022 and the fourth opening 1072 in the non-opening region can be more compact to reduce the size of the non-opening region.

At this point, the optical processing film 1023 is, for example, arranged to extend from a side wall of the second opening 1022 of the light shield layer 102 to a predetermined distance extending outwards continuously, as long as being arranged corresponding to the fourth opening 1072 and preventing light incident from the fourth opening 1072 from being reflected by the light shield layer 102, reflected by the functional layer on the light shield layer 102, and irradiated to the photosensitive sensor through the second opening 1022. Or, in some embodiments, the optical processing film 1023 is set within a predetermined distance extending outwards continuously from a small first distance from the second opening 1022. For instance, the first distance is less than 3 µm, as long as the optical processing film 1023 can prevent light incident from the fourth opening 1072 from being reflected by the light shield layer 102, reflected by the functional layer on the light shield layer 102, and irradiated to the photosensitive sensor through the second opening 1022.

In the embodiment, the functional layer, for example, the electrode layer 107, also includes at least one third opening 1071. The third opening 1071 is overlapped with the first opening 1021 in the direction perpendicular to the surface of the display panel, so that light running through the first opening 1021 and the third opening 1071 can be irradiated to the photosensitive sensor 101, and then the photosensitive sensor 101 may process and recognize the input light.

For instance, the functional layer may also include other conductive layers, not limited to the electrode layer. The specific form of the functional layer is not limited in the embodiment.

For instance, in the embodiment, the optical processing film 1023 includes light absorbing materials. At this point, when light is incident into the optical processing film 1023, the light will be absorbed by the optical processing film 1023 and will not be reflected. For instance, the light absorbing materials are black materials. At this point, the optical processing film 1023 is formed as a black film layer. For instance, the black materials are resin materials doped with black, or are materials such as metal or metal oxide which is basically black. No limitation will be given here in the embodiment.

For instance, the optical processing film 1023 may be disposed in a region of the light shield layer 102 close to the second opening 1022. For instance, the fourth opening 1072 of the electrode layer 107 and the optical processing film 1023 are completely overlapped in the direction perpendicular to the surface of the display panel. At this point, an orthographic projection of the fourth opening 1072 on the base substrate 100 is completely overlapped with an orthographic projection of the optical processing film 1023 on the base substrate 100. For instance, the orthographic projection of the fourth opening 1072 on the base substrate 100 falls inside the orthographic projection of the optical processing film 1023 on the base substrate 100 or the orthographic projections of both completely coincide with each other. The arrangement can better prevent light incident from the fourth opening 1072 from being incident into the photosensitive sensor 101 from the second opening 1022 of the light shield layer 102. For instance, in other examples, the optical processing film 1023 may be arranged around the second opening 1022, namely the optical processing film 1023 is arranged in a plurality of directions close to the second opening 1022, thereby preventing unnecessary light from being incident into the photosensitive sensor 101 from the plurality of directions of the second opening 1022.

For instance, in the embodiment, the display panel comprises a plurality of pixel units arranged on the base substrate 100. Each pixel unit includes a light emitting structure and a thin-film transistor (TFT) and a storage capacitor used for driving the light emitting structure. For instance, each pixel unit corresponds to at least one first opening 1021 and at least one second opening 1022. The photosensitive sensor 101 corresponds to the plurality of pixel units.

For instance, in the embodiment, the light shield layer 102 is a first conductive layer which includes a plurality of conductive parts. The plurality of conductive parts are respectively electrically connected with each pixel unit and configured to apply electrical signals, e.g., data signal and power voltage, to each pixel unit.

For instance, the display panel further comprises a second conductive layer 104 disposed on the base substrate 100. For instance, the second conductive layer 104 includes a source electrode and a drain electrode used for forming the TFT. The plurality of conductive parts of the first conductive layer, namely the light shield layer 102, are, for instance, respectively connected to the source electrode and the drain electrode in the second conductive layer 104 and then used for applying electrical signals, e.g., data signal and power voltage, to the source electrode and the drain electrode.

For instance, in the embodiment, the material of the light shield layer 102 may be metallic material, for instance, including one or more of titanium, aluminum and molybdenum. For instance, in some examples, the light shield layer 102 includes a titanium/aluminum/titanium laminated structure, a molybdenum/aluminum/molybdenum laminated structure, etc. At this point, the material of the optical processing film 1023 may be metal oxide material, for instance, including molybdenum oxide, etc. For instance, when the material of the light shield layer 102 includes molybdenum and the material of the optical processing film 1023 includes molybdenum oxide, the optical processing film 1023 may be formed by oxidizing a portion of a surface of the light shield layer 102, so the manufacturing process can be simplified.

For instance, the materials of the second conductive layer may be metallic materials or other suitable conductive materials, for instance, including metal such as titanium, aluminum, copper and molybdenum or alloy thereof. For instance, the electrode layer 107 may be metallic material, transparent conductive oxide or the like, for instance, including materials such as indium tin oxide (ITO) or indium zinc oxide (IZO). No specific limitation will be given to the material of the functional layers in the embodiment of the present disclosure.

In the embodiment, the display panel may also comprise other functional layers, for instance, including a display circuit for display, a driving circuit and the like, for instance, including a light emitting structure and a TFT and a storage capacitor used for driving the light emitting structure. For instance, as shown in FIGS. 2 and 3, the display panel also comprises a gate functional layer 103 disposed on the base substrate 100. The gate functional layer 103, for instance, includes structures such as a gate electrode and a gate insulation layer for forming the TFT. For instance, the display panel also comprises a plurality of insulating layers disposed among the conductive layers, for instance, including a first insulation layer 105 and a second insulation layer 106. For instance, the display panel also comprises a light emitting layer and other electrode layers (not shown in the figure) disposed on the electrode layer 107, so as to form the light emitting structure of the display panel. No limitation will be given to the specific structure of the display panel in the embodiment.

In the display panel provided by the embodiment, light incident from the first opening 1021 and the third opening 1071 may be irradiated to the photosensitive sensor 101, and the photosensitive sensor 101 may process and recognize the input light. At this point, the optical processing film 1023 can prevent incident light from being incident into the photosensitive sensor 101 from the second opening 1022, so as to avoid the effect of the unnecessary incident light on the sensing accuracy of the photosensitive sensor 101. Therefore, the photosensitive sensor 101 of the display panel has higher recognition precision and faster recognition speed, and the display panel has higher safety.

At least one embodiment of the present disclosure provides a manufacturing method of a display panel. The manufacturing method comprises: providing a photosensitive sensor, forming a light shield layer on a sensing side of the photosensitive sensor, and forming an optical processing film on the light shield layer. The light shield layer includes at least one first opening and at least one second opening. The first opening and the photosensitive sensor are overlapped with each other in a direction perpendicular to a surface of the display panel, so that light running through the first opening can be irradiated to the photosensitive sensor. The optical processing film is disposed in a region of the light shield layer close to the second opening and on at least a portion of a surface of the light shield layer away from the photosensitive sensor, and the light reflectivity of the optical processing film is less than the light reflectivity of the light shield layer.

For instance, in the embodiment, the manufacturing method of the display panel further comprises: providing a base substrate. For instance, the photosensitive sensor is formed on the base substrate, and the light shield layer is formed on a side of the photosensitive sensor away from the base substrate, namely as the case shown in FIG. 3. Or in another example, the light shield layer and the photosensitive sensor are respectively formed on two sides of the base substrate, namely as the case shown in FIG. 2. At this point, as shown in FIG. 2, for instance, after functional layers such as the light shield layer 102 and the optical processing film 1023 are formed on the base substrate 100, the photosensitive sensor 101 may be formed on the other side of the base substrate 100. Or after the photosensitive sensor 101 is formed on the base substrate 100, the functional layers such as the light shield layer 102 and the optical processing film 1023 are formed on the other side of the base substrate 100. No limitation will be given to the forming order of the functional layers in the embodiment of the present disclosure.

Description will be given below to the manufacturing method of the display panel by taking the case that the photosensitive sensor and the light shield layer are respectively formed on both sides of the base substrate as an example.

Figure 4A:
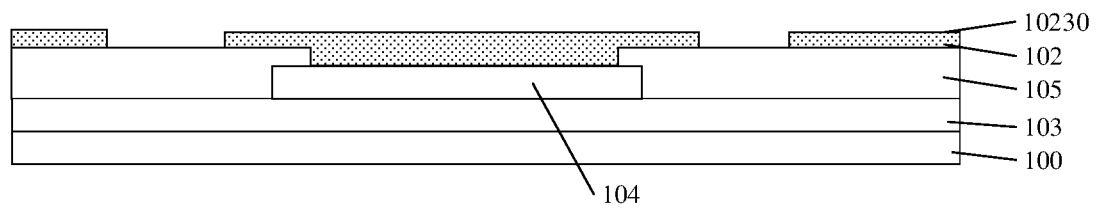
FIGS. 4A-4D are schematic diagrams illustrating a manufacturing process of the display panel provided by an embodiment of the present disclosure.

As shown in FIG. 4A, structures such as the gate functional layer 103, the second conductive layer 104, the first insulation layer 105 and the light shield layer 102 may be sequentially formed on the base substrate 100 by a photolithography process. For instance, one photolithography process includes processes such as photoresist coating, exposure, development and etching.

For instance, the gate functional layer 103 includes a gate electrode and a gate insulation layer (not shown in the figure). For instance, the forming the gate functional layer 103 includes forming the gate electrode by one photolithography process and forming the gate insulation layer by one photolithography process. Herein, the gate electrode may be made from a conductive material such as metal, for instance, metal such as titanium, aluminum and molybdenum or alloy materials thereof. The gate insulation layer, for instance, may be made from an organic insulation material or an inorganic insulation material, for instance, may be made from polyimide, silicon dioxide, etc.

For instance, the second conductive layer 104, the first insulation layer 105 and the light shield layer 102 may be respectively formed by one photolithography process. For instance, the second conductive layer 104 includes electrode patterns of a source electrode and a drain electrode, and may be made from a metallic material or other conductive materials, for instance, may adopt metal such as titanium, aluminum, copper and molybdenum or alloy thereof. The first insulation layer 105 may be made from organic insulation materials or inorganic insulation materials, for instance, may adopt polyimide, silicon dioxide, etc. For instance, the light shield layer 102 includes a plurality of conductive parts which are respectively connected to the source electrode and the drain electrode in the second conductive layer 104, and may be made from metallic materials, for instance, may adopt one or more selected from titanium, aluminum and molybdenum.

For instance, after the light shield layer 102 is formed, the optical processing film may be formed on a surface of the light shield layer 102. For instance, in one example, as shown in FIGS. 4B-4D, the forming the optical processing film includes: forming an optical processing film material layer 10230 on the light shield layer 102; and performing a photolithography process on the optical processing film material layer 10230, and forming the optical processing film 1023 in a region of the light shield layer 102 close to the second opening 102 and on at least a portion of a surface of the light shield layer 102 away from the light shield layer 102.

Figure 4B:
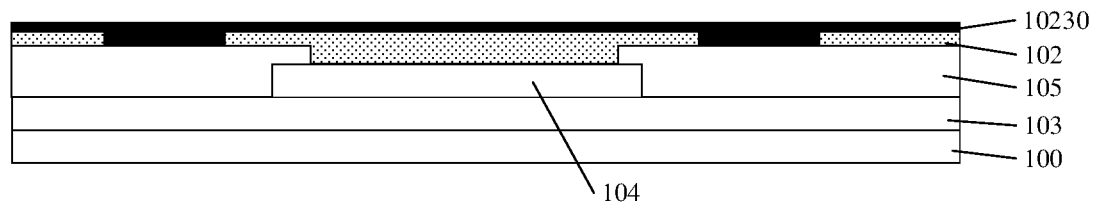
Figure 4C:
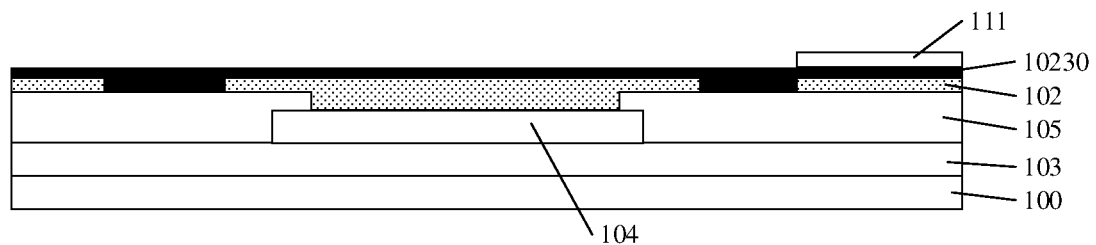
Figure 4D:
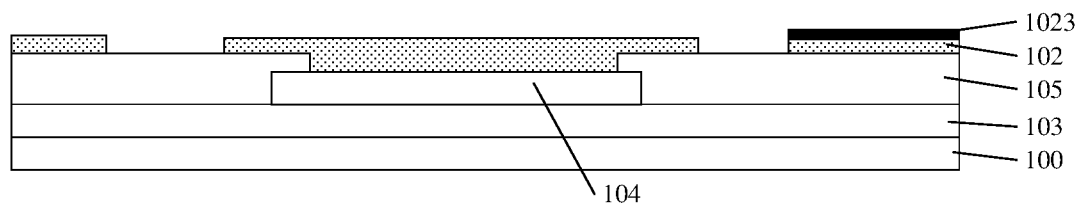

For instance, as shown in FIG. 4B, firstly, an entire layer of an optical processing film material layer 10230 is formed on the light shield layer 102. Then, a photoresist layer is formed on the optical processing film material layer 10230 and subjected to exposure and development to form a photoresist pattern 111. As shown in FIG. 4C, the formed photoresist pattern 111 covers a region in which the optical processing film 1023 is to be formed, namely a region of the light shield layer 102 close to the second opening 1022, and the photoresist pattern 111 exposes a region in which the optical processing film 1023 is not required to be formed. Then, the optical processing material layer 10230 is etched by adopting the photoresist pattern 111 as an etching mask. The etching process, for instance, may adopt dry etching or wet drying. The etching method may be selected according to the optical processing film material and the like. In the etching process, the optical processing film material exposed by the photoresist pattern 111 is etched and removed, and only a portion of the optical processing film material covered by the photoresist pattern 111 is retained. After etching, the photoresist pattern 111 is stripped off, and the optical processing film 1023 as shown in FIG. 4D is formed.

For instance, a material of the optical processing film 1023 may adopt a light absorption material. For instance, the light absorption material may be a black material. At this point, the optical processing film 1023 is formed as a black film layer. For instance, the black material is a resin material doped with black, or a material such as metal or metal oxide which is basically black. No limitation will be given here in the embodiment.

For instance, in one example, the material of the light shield layer 102 includes molybdenum, and the material of the optical processing film 1023 includes molybdenum oxide. At this point, as shown in FIGS. 5A-5D, the forming the optical processing film 1023 may include: performing an oxygen plasma treatment on the light shield layer 102 in a region of the light shield layer 102 close to the second opening 1022 and on at least a portion of a surface of the light shield layer 102 away from the photosensitive sensor 101, to form the optical processing film 1023 on a surface of the light shield layer 102. At this point, the optical processing film 1023 is formed by oxidizing a surface material of the light shield layer 102.

Figure 5A:
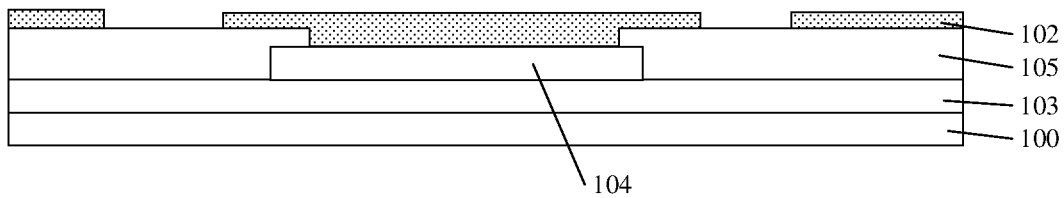
FIGS. 5A-5D are schematic diagrams illustrating a manufacturing process of another display panel provided by an embodiment of the present disclosure.
Figure 5B:
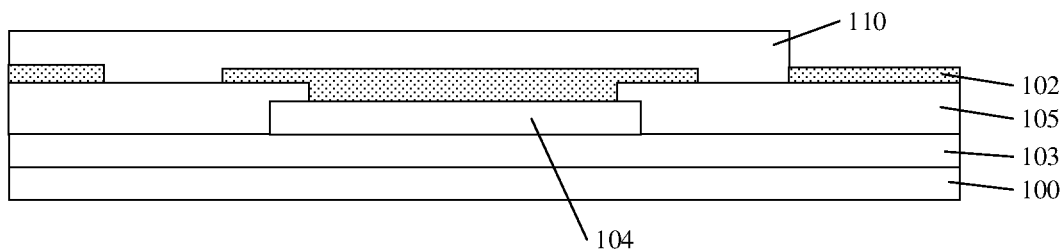
Figure 5C:
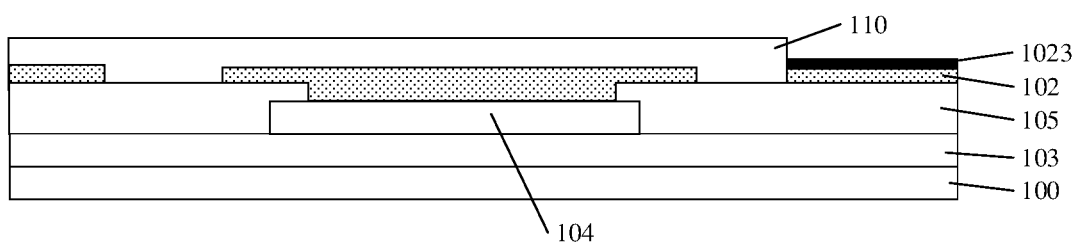
Figure 5D:
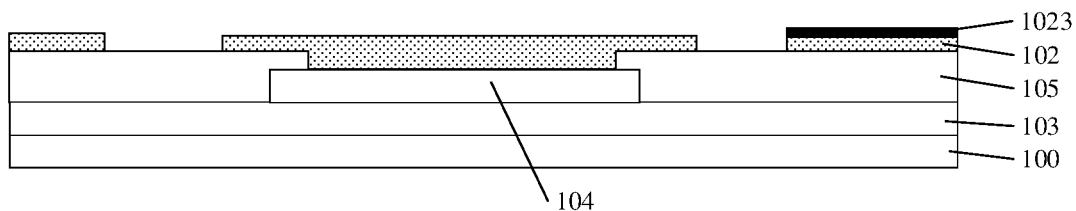

For instance, as shown in FIG. 5A, after forming functional layers such as the light shield layer 102 on the base substrate 100 by a photolithography process, as shown in FIG. 5B, the photoresist pattern 110 is formed on the light shield layer 102. The photoresist pattern 110 exposes a region in which the optical processing film 1023 is to be formed, that is, a region of the light shield layer 102 close to the second opening 1022 and at least a portion of a surface of the light shield layer 102 away from the photosensitive sensor 101. Subsequently, the light shield layer 102 is subjected to oxide plasma treatment by taking the photoresist pattern 110 as a mask. As shown in FIG. 5C, the material molybdenum on the surface of the light shield layer 102 exposed by the photoresist pattern 110 is subjected to oxidation reaction to form molybdenum oxide, namely form the material of the optical processing film 1023. After a certain amount of molybdenum oxide is formed, the photoresist pattern 110 is stripped off to form the optical processing film 1023 as shown in FIG. 5D.

For instance, in another example, when the material of the light shield layer includes molybdenum and the material of the optical processing film includes molybdenum oxide, the optical processing film may also be formed by other methods. For instance, the forming the optical processing film may include: under an oxygen atmosphere, depositing material molybdenum in a region of the light shield layer close to the second opening and on at least a portion of a surface of the light shield layer away from the photosensitive sensor, so that the material finally deposited on the light shield layer includes molybdenum oxide. For instance, as shown in FIG. 5B, after the photoresist pattern 110 is formed, material molybdenum is deposited on the light shield layer 102 under an oxygen atmosphere and then may react with oxygen in the air during molybdenum deposition, so that the material finally deposited on the light shield layer 102 includes molybdenum oxide, that is, the optical processing film 1023 whose material is molybdenum oxide is formed.

Figure 6:
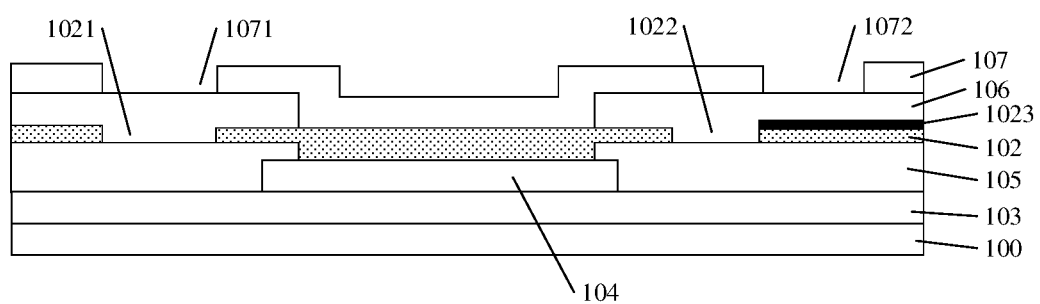
FIG. 6 is a schematic diagram illustrating a manufacturing process of still another display panel provided by an embodiment of the present disclosure.

For instance, in the embodiment, as shown in FIG. 6, after the optical processing film 1023 is formed, the manufacturing method of the display panel provided by the embodiment further comprises: forming other functional layers on a side of the light shield layer 102 away from the photosensitive sensor 101, for instance, sequentially forming the second insulation layer 106, the electrode layer 107 and the light emitting layer (not shown in the figure) by a photolithography process.

For instance, the second insulation layer 106 may be made from an organic insulation material or an inorganic insulation material, for instance, may adopt polyimide, silicon dioxide, etc. The electrode layer 107 may be made from a metallic material, a transparent conductive oxide or the like, for instance, may adopt a material such as ITO and IZO. No limitation will be given to the forming material of the functional layers in the embodiment.

For instance, the formed electrode layer 107 includes at least one fourth opening 1072, and the fourth opening and at least a portion of the optical processing film 1023 are overlapped with each other in a direction perpendicular to the surface of the display panel. For instance, the electrode layer 107 also includes at least one third opening 1071, and the third opening 1071 and the first opening 1021 are overlapped with each other in the direction perpendicular to the surface of the display panel.

For instance, in the embodiment, after the functional layers on the base substrate 100 are formed, the photosensitive sensor 101 may be formed on the other side of the base substrate 100, so as to form the display panel as shown in FIG. 2. For instance, the photosensitive sensor 101 may be a preformed independent structure. Thus, after the functional layers on the base substrate 100 are formed, the photosensitive sensor 101 may be entirely bonded to the other side of the base substrate 100.

For instance, the photosensitive sensor 101 may be a sensor with personal identification function such as line recognition (such as fingerprint recognition or palm print recognition) and iris recognition. In the display panel, light incident from the first opening 1021 and the third opening 1071 may be irradiated to the photosensitive sensor 101, and the photosensitive sensor 101 may process and recognize the input light. At this point, the optical processing film 1023 can prevent the incident light from being incident into the photosensitive sensor 101 from the second opening 1022, so as to prevent unnecessary incident light from affecting the sensing accuracy of the photosensitive sensor 101. Therefore, the photosensitive sensor 101 of the display panel has higher recognition precision and faster recognition speed, and the display panel has higher safety.

Figure 7:
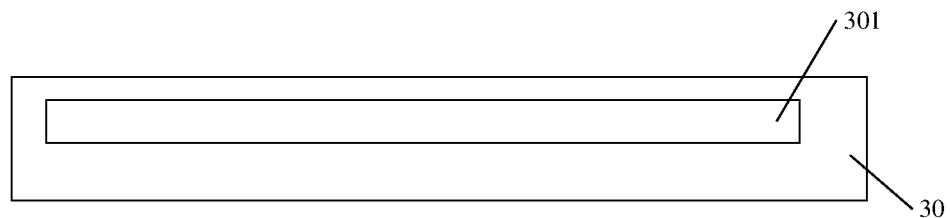
FIG. 7 is a schematic diagram of a display device provided by an embodiment of the present disclosure.

At least one embodiment of the present disclosure provides a display device. As shown in FIG. 7, the display device 30 comprises any foregoing display panel 301. For instance, the display device 30 may be any product or component with display function such as a mobile phone, a tablet computer, a television, a display, a notebook computer, a digital photo frame, a navigator, or the like, which are not limited in the embodiments of the present disclosure.

The following statements should be noted:

(1) The accompanying drawings of the embodiment(s) of the present disclosure involve only the structure(s) in connection with the embodiment(s) of the present disclosure, and other structure(s) can be referred to common design(s).

(2) For the purpose of clarity only, in accompanying drawings for illustrating the embodiment(s) of the present disclosure, the thickness and size of a layer or a region may be enlarged or reduced, that is, the accompanying drawings are not drawn according to the actual scale. It should understood that, in the case in which a component or element such as a layer, film, region, substrate or the like is referred to be "on" or "under" another component or element, it may be directly on or under the another component or element or a component or element is interposed therebetween.

(3) In case of no conflict, features in one embodiment or in different embodiments can be combined to obtain a new embodiment.

What are described above is related to the specific embodiments of the disclosure only and not limitative to the scope of the disclosure. The protection scope of the disclosure shall be based on the protection scope of the claims. Any modification and equivalent replacement may be made by those skilled in the art within the substantial protection scope of the embodiments of the present disclosure, which is regarded as falling within the protection scope of embodiments of the present disclosure.

The invention claimed is:

1. A display panel, comprising:
    a photosensitive sensor;
    a light shield layer, disposed on a sensing side of the photosensitive sensor, and including at least one first opening and at least one second opening, in which the first opening and the photosensitive sensor are overlapped with each other in a direction perpendicular to a surface of the display panel, so that light running through the first opening is irradiated to the photosensitive sensor;
    an optical processing film, disposed in a region of the light shield layer close to the second opening and directly disposed on at least a portion of a surface of the light shield layer away from the photosensitive sensor, in which a light reflectivity of the optical processing film is less than a light reflectivity of the light shield layer; and
    a functional layer, disposed on a side of the light shield layer away from the photosensitive sensor,
    wherein the functional layer includes at least one fourth opening, and the fourth opening and at least a portion of the optical processing film are overlapped with each other in the direction perpendicular to the surface of the display panel,
    wherein the second opening is defined by different portion of a same light shield layer, the fourth opening is defined by different portion of a same functional layer,
    wherein an orthographic projection of the second opening in a direction parallel to the surface of the display panel is close to an orthographic projection of the fourth opening in the direction parallel to the surface of the display panel; and all portions of the second opening is shielded by a non-opening region of the functional layer which defines the fourth opening in the direction perpendicular to the surface of the display panel,
    wherein the fourth opening completely overlaps with the optical processing film in the direction perpendicular to the surface of the display panel and the orthographic projection of the fourth opening is completely covered by an orthographic projection of the optical processing film on the surface of the display panel,
    wherein the functional layer is disposed on a side of the light optical processing film away from the light shield layer,
    wherein the optical processing film includes a light absorption material.

2. The display panel according to claim 1, wherein the functional layer also includes at least one third opening; and
    the third opening and the first opening are overlapped with each other in the direction perpendicular to the surface of the display panel, so that light running through the first opening and the third opening is irradiated to the photosensitive sensor.

3. The display panel according to claim 1, wherein an orthographic projection of the second opening in a direction parallel to the surface of the display panel is close to an orthographic projection of the fourth opening in the direction parallel to the surface of the display panel; and the second opening corresponds to a non-opening region of the functional layer.

4. The display panel according to claim 1, wherein the functional layer includes an electrode layer; and the photosensitive sensor is configured for line recognition.

5. The display panel according to claim 1, further comprising a base substrate, wherein
    the photosensitive sensor is disposed on the base substrate; and the light shield layer is disposed on a side of the photosensitive sensor away from the base substrate.

6. The display panel according to claim 5, wherein the display panel comprises a plurality of pixel units disposed on the base substrate;
    each of the plurality of pixel units corresponds to at least one first opening and at least one second opening; and
    the photosensitive sensor corresponds to the plurality of pixel units.

7. The display panel according to claim 6, wherein the light shield layer is a first conductive layer, and the first conductive layer includes: a plurality of conductive parts that are electrically connected to each of the plurality of pixel units and configured to apply electrical signals to each of the plurality of pixel units.

8. The display panel according to claim 1, further comprising a base substrate, wherein
    the photosensitive sensor and the light shield layer are respectively disposed on two sides of the base substrate.

9. The display panel according to claim 1, wherein a material of the light shield layer includes one or more selected from titanium, aluminum and molybdenum; and a material of the optical processing film includes molybdenum oxide.

10. A display device, comprising the display panel according to claim 1.

11. A manufacturing method of a display panel, comprising:
    providing a photosensitive sensor;
    forming a light shield layer on a sensing side of the photosensitive sensor,
    wherein the light shield layer includes at least one first opening and at least one second opening, and the first opening and the photosensitive sensor are overlapped with each other in a direction perpendicular to a surface of the display panel, so that light running through the first opening is irradiated to the photosensitive sensor;

forming an optical processing film, in which the optical processing film is formed in a region of the light shield layer close to the second opening and directly disposed on at least a portion of a surface of the light shield layer away from the photosensitive sensor, and a light reflectivity of the optical processing film is less than a light reflectivity of the light shield layer; and forming a functional layer on a side of the light shield layer away from the photosensitive sensor, wherein the functional layer includes at least one fourth opening, and the fourth opening and at least a portion of the optical processing film are overlapped with each other in the direction perpendicular to the surface of the display panel, wherein an orthographic projection of the second opening in a direction parallel to the surface of the display panel is close to an orthographic projection of the fourth opening in the direction parallel to the surface of the display panel; and all portions of the second opening is shielded by a non-opening region of the functional layer in the direction perpendicular to the surface of the display panel, wherein the second opening is defined by different portion of a same light shield layer, the fourth opening is defined by different portion of a same functional layer, the fourth opening completely overlaps with the optical processing film in the direction perpendicular to the surface of the display panel and the orthographic projection of the fourth opening is completely covered by an orthographic projection of the optical processing film on the surface of the display panel, wherein the functional layer is disposed on a side of the light optical processing film away from the light shield layer, wherein the optical processing film includes a light absorption material.

12. The manufacturing method of the display panel according to claim 11, wherein the forming the optical processing film includes:

forming an optical processing film material layer on the light shield layer; and performing a photolithography process on the optical processing film material layer, and forming the optical processing film in the region of the light shield layer close to the second opening and on at least a portion of a surface of the light shield layer away from the photosensitive sensor.

13. The manufacturing method of the display panel according to claim 11, wherein a material of the light shield layer includes molybdenum, and a material of the optical processing film includes molybdenum oxide; and the forming the optical processing film includes: performing oxide plasma treatment on the light shield layer in the region of the light shield layer close to the second opening and on at least a portion of a surface of the light shield layer away from the photosensitive sensor, to form the optical processing film on the surface of the light shield layer.

14. The manufacturing method of the display panel according to claim 13, wherein the forming the optical processing film also includes:

forming a photoresist pattern on the light shield layer, in which the photoresist pattern exposes the region of the light shield layer close to the second opening and the at least the portion of a surface of the light shield layer away from the photosensitive sensor; and subsequently performing oxide plasma treatment on the light shield layer.

15. The manufacturing method of the display panel according to claim 11, wherein a material of the light shield layer includes molybdenum, and a material of the optical processing film includes molybdenum oxide; and the forming the optical processing film includes: depositing material molybdenum under an oxygen atmosphere in the region of the light shield layer close to the second opening and on at least a portion of a surface of the light shield layer away from the photosensitive sensor, so that a material finally deposited on the light shield layer includes molybdenum oxide.

16. The manufacturing method of the display panel according to claim 11, further comprising:

providing a base substrate, in which the photosensitive sensor is formed on the base substrate, and the light shield layer is formed on a side of the photosensitive sensor away from the base substrate.

17. The manufacturing method of the display panel according to claim 11, further comprising:

providing a base substrate, in which the light shield layer and the photosensitive sensor are respectively formed on two sides of the base substrate.

* * * * *